United States Patent
Allen

(10) Patent No.: US 6,446,948 B1
(45) Date of Patent: Sep. 10, 2002

(54) VACUUM CHUCK FOR REDUCING DISTORTION OF SEMICONDUCTOR AND GMR HEAD WAFERS DURING PROCESSING

(75) Inventor: Donald Giles Allen, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/535,617

(22) Filed: Mar. 27, 2000

(51) Int. Cl.[7] .......................... B25B 11/00; C23C 16/00; C23F 1/02
(52) U.S. Cl. .......................... 269/21; 118/728; 118/500; 118/503; 156/345.51
(58) Field of Search .................. 118/728, 500, 118/503; 156/345, 345.51; 269/21

(56) References Cited

U.S. PATENT DOCUMENTS

| | | | |
|---|---|---|---|
| 4,313,284 A | 2/1982 | Walsh | |
| 4,860,229 A | 8/1989 | Abbe et al. | |
| 4,874,463 A | 10/1989 | Koze et al. | |
| 4,931,962 A | 6/1990 | Palleiko | |
| 5,094,536 A | 3/1992 | MacDonald | |
| 5,191,218 A | 3/1993 | Mori et al. | |
| 5,389,579 A | 2/1995 | Wells | |
| 5,564,682 A | 10/1996 | Tsuji | |
| 5,618,759 A | 4/1997 | Boysel | |
| 5,692,873 A | 12/1997 | Weeks et al. | |
| 5,707,051 A | 1/1998 | Tsuji | |
| 5,899,445 A | 5/1999 | Kimble | |
| 6,173,648 B1 * | 1/2001 | Misono et al. .............. 101/474 |

* cited by examiner

Primary Examiner—Jeffrie R. Lund

(57) ABSTRACT

A flat vacuum chuck for restraining semiconductor wafer substrates and the like during processing applies a vacuum through holes in the chuck in a timed sequence. The localized areas of the wafer adjacent to each of the holes adhere to the chuck in a pattern that is controlled in such a way so as to minimize any residual gaps therebetween. In one application, the vacuum sequencing pattern is analogous to smoothing a curled sheet of paper on a flat surface with both hands by starting at or near the center of the sheet and moving both hands outward along the surface until the sheet is flat. The vacuum may be applied to substrates to overcome all types of distortions, including symmetrical, asymmetrical, and multi-plane distortions, depending upon the orientation of the net internal stresses resulting from the layers deposited on the wafer. The sequenced application of the vacuum through the chuck holes can be timed by installing a solenoid valve on each of the vacuum tubes connected to the ports. Alternatively, the vacuum applied through the chuck holes can be controlled by a single valve via different length tubes between the valve and the surface of the chuck. The holes with the shorter tubes reach nominal vacuum pressure sooner than those with longer tubes.

15 Claims, 5 Drawing Sheets

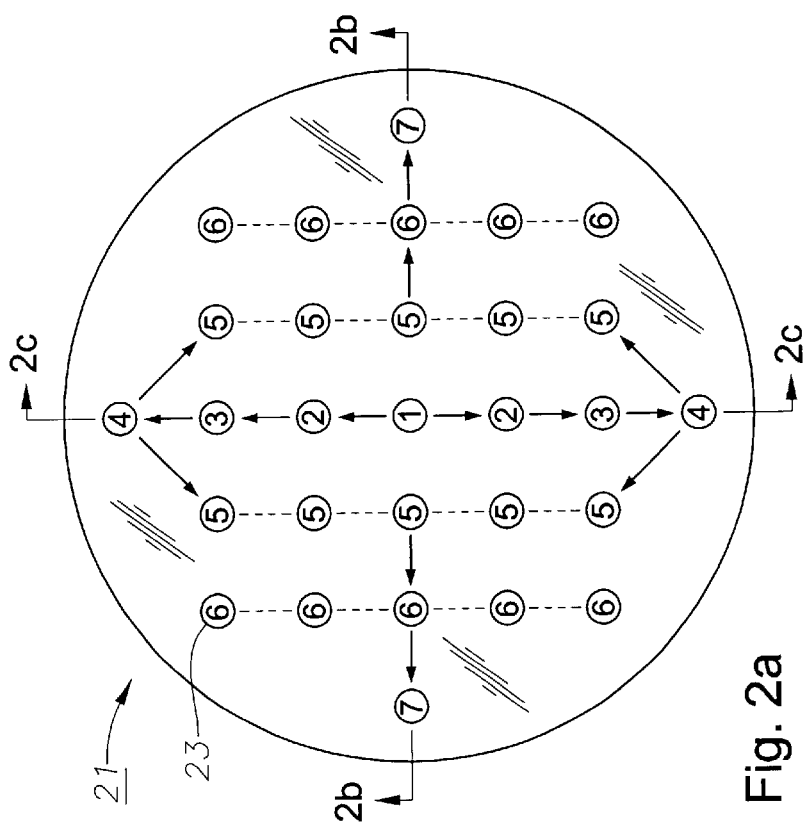
Fig. 2a
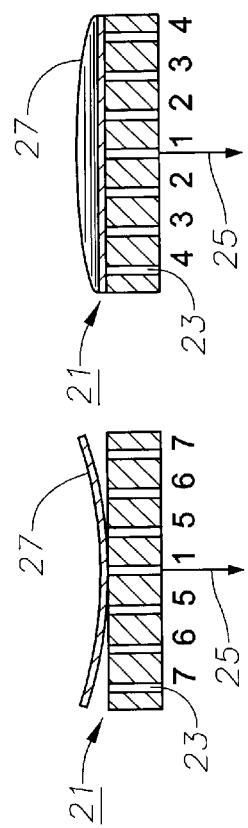
Fig. 2c
Fig. 2b
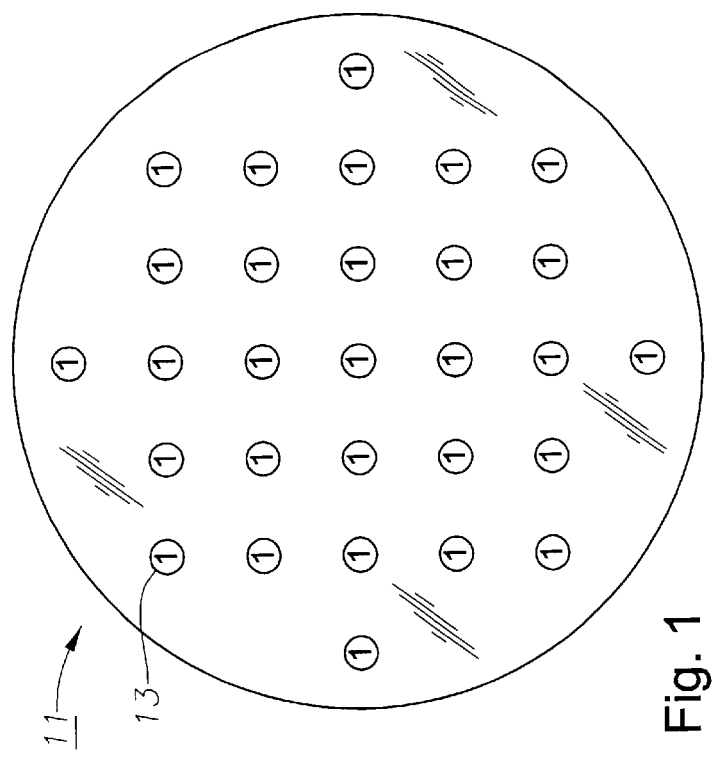
Fig. 1
(Prior Art)

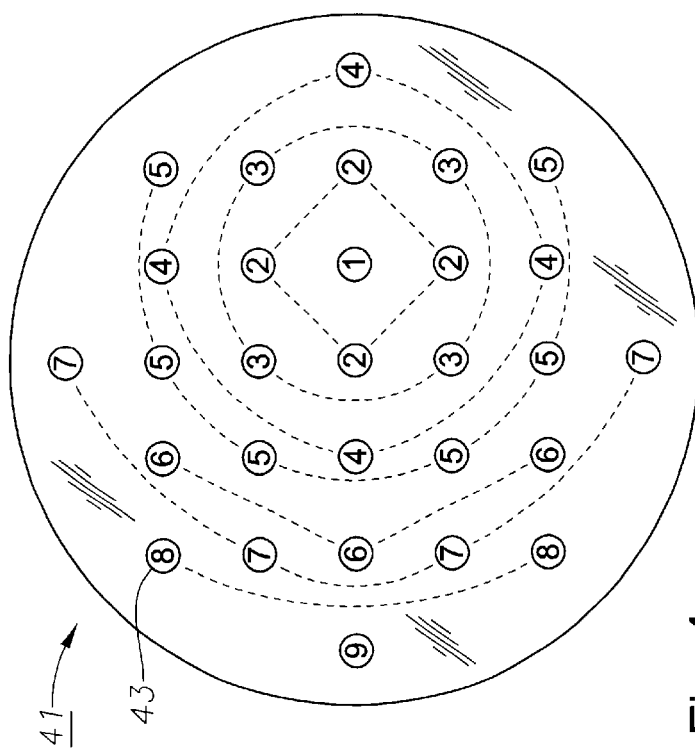
Fig. 4
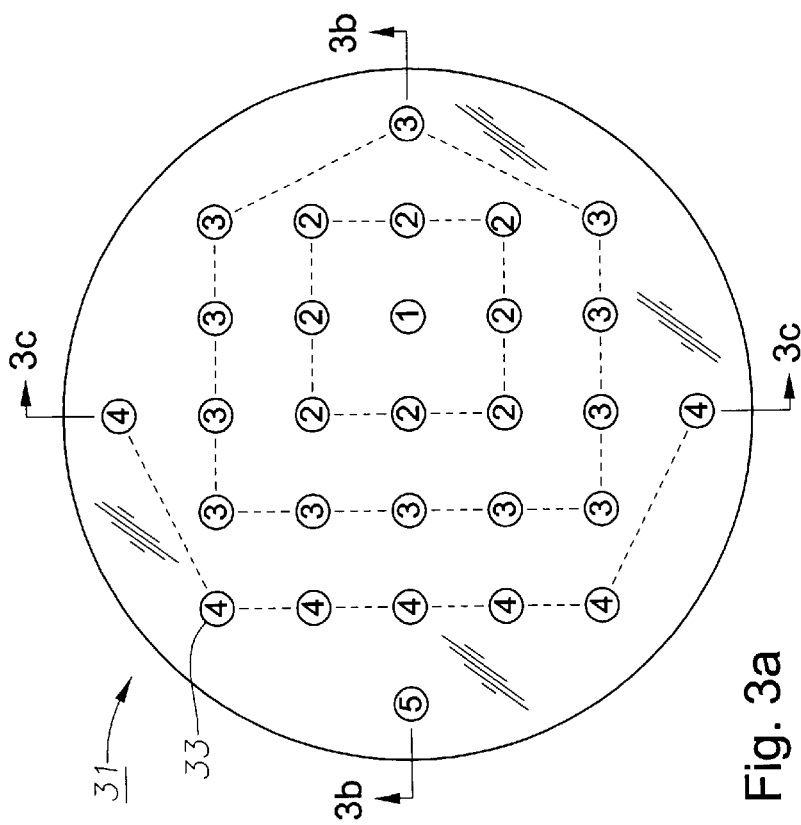
Fig. 3a
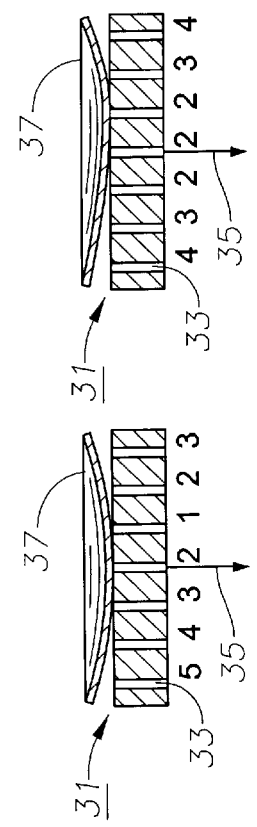
Fig. 3b
Fig. 3c

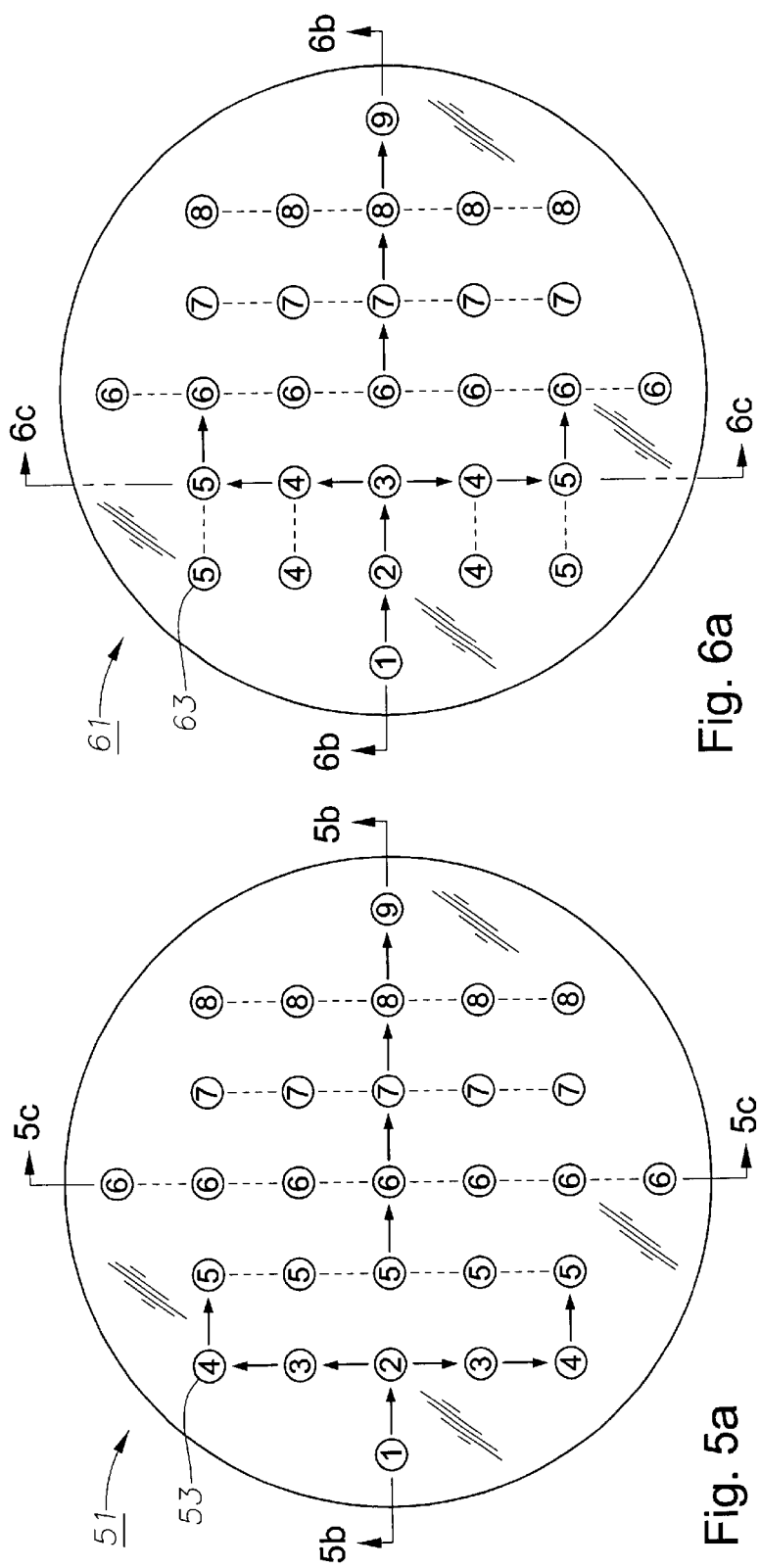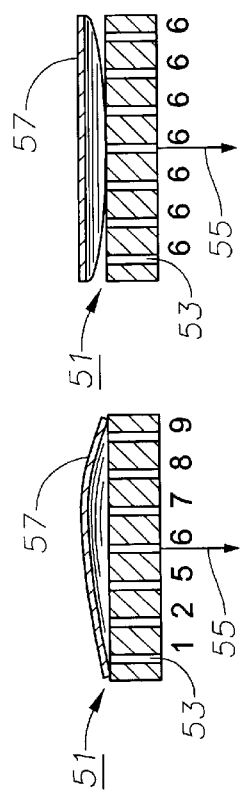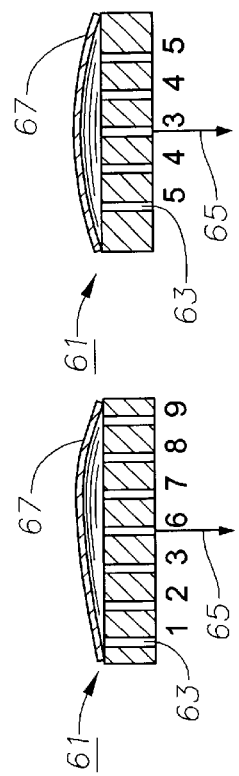

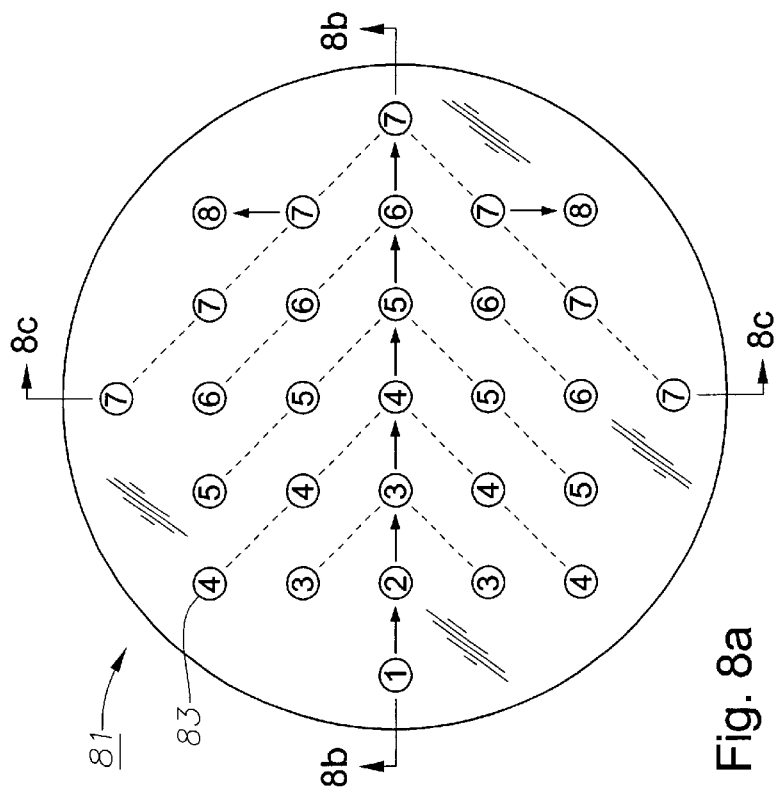
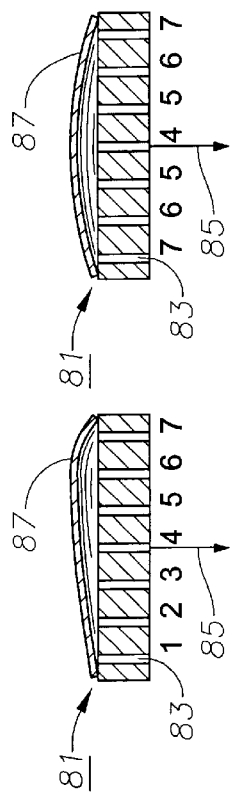
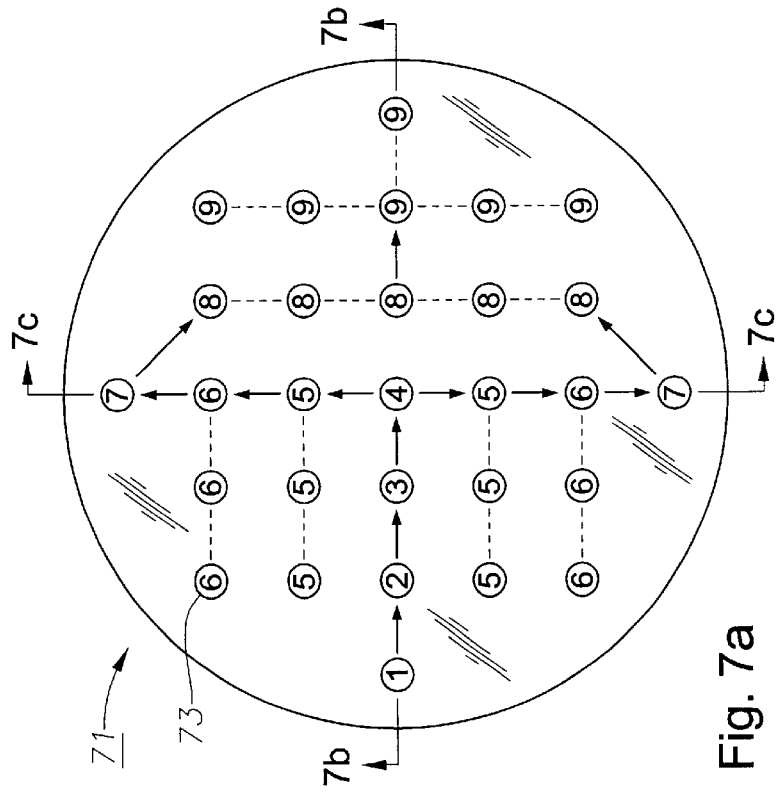
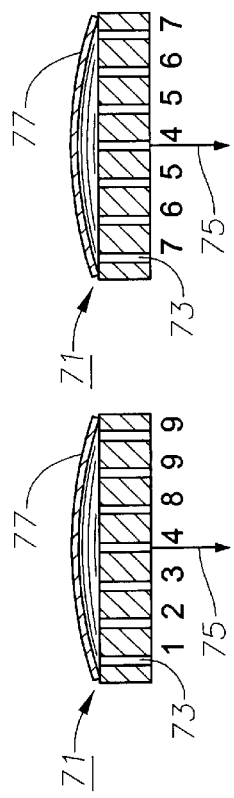

VACUUM CHUCK FOR REDUCING DISTORTION OF SEMICONDUCTOR AND GMR HEAD WAFERS DURING PROCESSING

BACKGROUND OF THE INVENTION

1. Technical Field

The present invention relates in general to improved semiconductor wafer processing, and in particular to improving flatness between a semiconductor wafer and a vacuum chuck. Still more particularly, the present invention relates to an improved apparatus and method for applying a vacuum to a semiconductor wafer through a vacuum chuck to improve flatness of the wafer during processing.

2. Description of the Related Art

As semiconductor or giant magneto resistive (GMR) head wafers are processed, various metallic and non-metallic layers are deposited on one side of the original wafer substrate. Even if the original substrate is very flat, the deposition of material layers with residual tensile or compressive stresses on only one side of the wafer will cause the entire wafer to distort from its original state of flatness in directions normal to the plane of the wafer. Because of this distortion, there is a need for the wafer to be held and restrained as flat as possible during the various process steps, such as photoresist application and exposure, material deposition, and metrology. Photoresist exposure processing is particularly sensitive to flatness since non-flat deviations can lead to location errors of the features being printed on the wafer, and oversized or undersized feature printing.

Prior art process machines utilize a vacuum chuck to hold the wafer flat during processing. A vacuum chuck is a platform that may be larger, smaller, or the same size as the wafer. The wafer is placed on the chuck by an operator or a robot with the non-processed side of the wafer facing downward against the chuck. Typically, the surface of the chuck is held to an extremely tight flatness tolerance, although non-flat shapes such as spherical or cylindrical shapes also can be used. The face of the vacuum chuck facing the wafer usually has many open holes through which a vacuum is applied. The vacuum originates from an outside vacuum source via tubes or tubular ports inside the chuck. During processing, the vacuum holds the wafer in place on the chuck. After processing, the vacuum is discontinued so that the wafer may be removed from the chuck.

Most prior art process machines apply the vacuum to all of the holes in the face of the chuck at the same time. For example, FIG. 1 depicts a flat, circular vacuum chuck 11 with a plurality of vacuum holes 13 arrayed across its surface. The small numerals located adjacent to the lower right side of each of the holes 13, schematically illustrate the timing sequence of the vacuum applied to the holes 13. In FIG. 1, since each of the holes 13 has the same numeral "1", the vacuum is applied to each of the holes 13 at the same time.

However, since neither the wafers nor the vacuum chucks are perfectly flat, a problem arises with this prior art method as the vacuum is applied simultaneously across all of the holes. The localized areas on the wafer where the gaps between the wafer and the chuck are smallest will adhere to the chuck first. Other areas on the wafer, where the gaps between the wafer and the chuck are larger, will not be pulled tightly against the chuck due to static friction between the wafer and the chuck at the earlier adhesion areas. As a result, tiny gaps remain between the wafer and the chuck such that the wafer does not completely deform to the flat shape of the chuck. These gaps of separation can be even larger when the wafer substrates are made from rigid materials such as the titanium carbide used to manufacture GMR heads.

U.S. Pat. No. 5,094,536 discloses a deformable vacuum chuck with distorting actuators that may be manipulated to directly compensate for distortions in a wafer. This is a very elaborate and complicated mechanical apparatus that requires feedback from an interferometer system. U.S. Pat. No. 5,564,682 discloses a sequenced vacuum method for correcting symmetrical, single-plane wafer distortions around a line that is perpendicular to the wafer and through its center. Unfortunately, this reference has very limited application since many wafer distortions are asymmetrical and/or exist in multiple planes. Thus, an improved apparatus and method for improving flatness between a semiconductor wafer and vacuum chuck is needed.

SUMMARY OF THE INVENTION

A flat vacuum chuck for restraining semiconductor wafer substrates and the like during processing applies a vacuum through holes in the chuck in a timed sequence. The localized areas of the wafer adjacent to each of the holes adhere to the chuck in a pattern that is controlled in such a way so as to minimize any residual gaps therebetween. In one application, the vacuum sequencing pattern is analogous to smoothing a curled sheet of paper on a flat surface with both hands by starting at or near the center of the sheet and moving both hands outward along the surface until the sheet is flat. The vacuum may be applied to substrates to overcome all types of distortions, including symmetrical, asymmetrical, and multi-plane distortions, depending upon the orientation of the net internal stresses resulting from the layers deposited on the wafer. The sequenced application of the vacuum through the chuck holes can be timed by installing a solenoid valve on each of the vacuum tubes connected to the ports. Alternatively, the vacuum applied through the chuck holes can be controlled by a single valve via different length tubes between the valve and the surface of the chuck. The holes with the shorter tubes reach nominal vacuum pressure sooner than those with longer tubes.

Accordingly, it is an object of the present invention to provide improved semiconductor wafer processing.

It is an additional object of the present invention to provide improved flatness between a semiconductor wafer and a vacuum chuck.

Still another object of the present invention is to provide an improved apparatus and method for applying a vacuum to a semiconductor wafer through a vacuum chuck to improve flatness of the wafer during processing.

The foregoing and other objects and advantages of the present invention will be apparent to those skilled in the art, in view of the following detailed description of the preferred embodiment of the present invention, taken in conjunction with the appended claims and the accompanying drawings.

BRIEF DESCRIPTION OF THE DRAWINGS

So that the manner in which the features, advantages and objects of the invention, as well as others which will become apparent, are attained and can be understood in more detail, more particular description of the invention briefly summarized above may be had by reference to the embodiment thereof which is illustrated in the appended drawings, which drawings form a part of this specification. It is to be noted, however, that the drawings illustrate only a preferred embodiment of the invention and is therefore not to be considered limiting of its scope as the invention may admit to other equally effective embodiments.

FIG. 1 is a schematic diagram of a prior art vacuum pattern for a semiconductor wafer vacuum chuck.

FIG. 2a is a schematic top view of a first embodiment of a vacuum pattern for a semiconductor wafer vacuum chuck and is constructed in accordance with the invention.

FIG. 2b is a schematic sectional side view of the chuck in FIG. 2a taken along the line 2b—2b and shown with a distorted wafer.

FIG. 2c is a schematic sectional end view of the chuck in FIG. 2a taken along the line 2c—2c and shown with a distorted wafer.

FIG. 3a is a schematic top view of a second embodiment of a vacuum pattern for the semiconductor wafer vacuum chuck of FIG. 2a.

FIG. 3b is a schematic sectional side view of the chuck in FIG. 3a taken along the line 3b—3b and shown with a distorted wafer.

FIG. 3c is a schematic sectional end view of the chuck in FIG. 3a taken along the line 3c—3c and shown with a distorted wafer.

FIG. 4 is a schematic top view of a third embodiment of a vacuum pattern for the semiconductor wafer vacuum chuck of FIG. 2a.

FIG. 5a is a schematic top view of a fourth embodiment of a vacuum pattern for the semiconductor wafer vacuum chuck of FIG. 2a.

FIG. 5b is a schematic sectional side view of the chuck in FIG. 5a taken along the line 5b—5b and shown with a distorted wafer.

FIG. 5c is a schematic sectional side view of the chuck in FIG. 5a taken along the line 5c—5c and shown with a distorted wafer.

FIG. 6a is a schematic top view of a fifth embodiment of a vacuum pattern for the semiconductor wafer vacuum chuck of FIG. 2a.

FIG. 6b is a schematic sectional side view of the chuck in FIG. 6a taken along the line 6b—6b and shown with a distorted wafer.

FIG. 6c is a schematic sectional end view of the chuck in FIG. 6a taken along the line 6c—c and shown with a distorted wafer.

FIG. 7a is a schematic top view of a sixth embodiment of a vacuum pattern for the semiconductor wafer vacuum chuck of FIG. 2a.

FIG. 7b is a schematic sectional side view of the chuck in FIG. 7a taken along the line 7b—7b and shown with a distorted wafer.

FIG. 7c is a schematic sectional end view of the chuck in FIG. 7a taken along the line 7c—7c and shown with a distorted wafer.

FIG. 8a is a schematic top view of a seventh embodiment of a vacuum pattern for the semiconductor wafer vacuum chuck of FIG. 2a.

FIG. 8b is a schematic sectional side view of the chuck in FIG. 8a taken along the line 8b—8b and shown with a distorted wafer.

FIG. 8c is a schematic sectional end view of the chuck in FIG. 8a taken along the line 8c—8c and shown with a distorted wafer.

DETAILED DESCRIPTION OF THE PREFERRED EMBODIMENT

Figure 9:
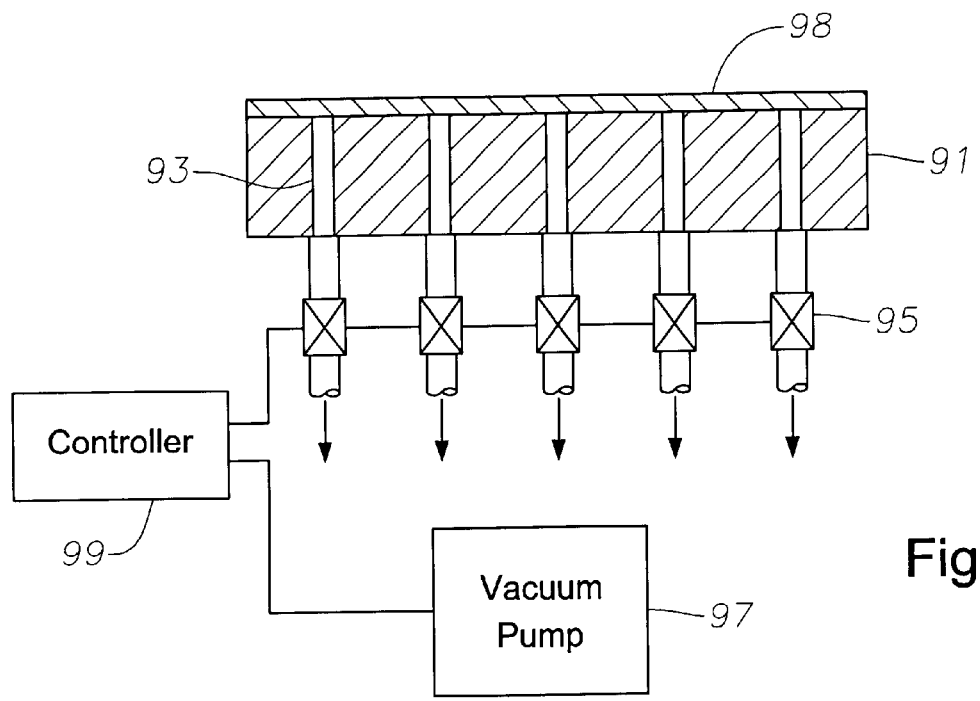
FIG. 9 is a schematic sectional side view of a vacuum chuck with a first version of a mechanism for sequencing a vacuum across the chuck.

As described in the Background section of this disclosure, semiconductor wafers and the like become distorted as various metallic and non-metallic layers are deposited on one side of the original wafer substrate during processing. Even if the original substrate is very flat, the deposition of material layers with residual tensile or compressive stresses on only one side of the wafer will cause the entire wafer to distort from its original state of flatness in directions normal to the plane of the wafer.

When the net internal stresses applied by the layers deposited on the wafer are compressive, the wafer typically bows in a generally "concave" manner. To prevent residual gaps between a concave wafer and the chuck, the vacuum timing sequences of embodiments of FIGS. 2–4 of the invention are suggested. When the net internal stresses applied by the layers deposited on the wafer are tensile in nature, the wafer typically bows in a generally "convex" manner. To prevent residual gaps between a convex wafer and the chuck, the vacuum timing sequences of embodiments of FIGS. 5–8 of the invention are suggested. These embodiments are described in detail below.

Referring to FIGS. 2a, 2b, and 2c, a first embodiment of a system and method for processing a subject workpiece such as a semiconductor wafer substrate or the like is depicted as a vacuum chuck 21. Chuck 21 has an array of a plurality of ports or holes 23 which extend through it. In the version shown, chuck 21 is a hard, flat, circular surface with 29 holes 23. At least some of the holes 23 lie along a lateral axis of chuck 21 (i.e., horizontally, or left to right), and some of the holes 23 lie along a transverse axis of chuck 21 (i.e., vertically, or top to bottom). However, chuck 21 may comprise many different shapes and sizes with more or fewer holes 23, depending upon the application.

A vacuum is drawn through holes 23 via a vacuum source 25 (represented by the arrows in FIGS. 2b and 2c) in order to pull a distorted wafer 27 tight against the flat chuck 21. In FIGS. 2b and 2c, the curvature or distortion of wafer 27 is greatly exaggerated to better illustrate the advantages of the invention. The small, single digit numerals located adjacent to the lower right of each of the holes 23 schematically illustrate the timing sequence of the vacuum applied to the holes 23. The vacuum is first drawn through the centermost hole 23 which has the numeral "1." The two holes 23 located directly above and below the centermost hole 23 (FIG. 2a) are labeled "2" since the vacuum is applied to each of these holes 23 shortly after the vacuum is applied to the centermost hole 23. Next, the timing sequence radially progresses to the two holes 23 that are labeled "3," and so on. In FIG. 2a, the small arrows and the dashed lines joining respective ones of the like-enumerated holes 23 are provided for graphically illustrating the timing sequence for the vacuum.

The first embodiment of FIGS. 2a—2c is suited for correcting asymmetrical distortion of a wafer that is only distorted in one plane, such as the uniformly crosssectioned, arcuate or concave wafer 27 in FIGS. 2b and 2c. Wafer 27 only distorts or "bows" in the plane and direction shown in FIG. 2b; it does not bow in any other direction as shown by the flat cross-sectional shape in FIG. 2c. The vacuum timing sequence illustrated and described above initially draws wafer 27 tight against chuck 21 where the gap between them is consistent and smallest (i.e., the central width or "spine" of wafer 27 shown in FIG. 2c; e.g., vertically). The system then progressively or incrementally evacuates the surrounding columns of holes 23 (FIG. 2a) such that the next-smallest gap between wafer 27 and chuck 21 is minimized (the holes 23 enumerated "5" in FIGS. 2a and 2b), and so on. Sequencing the vacuum in this manner ensures that any residual gaps between chuck 21 and wafer 27 are overcome and minimized.

Referring now to FIGS. 3a–3c, a second embodiment of a system and method for processing a wafer is shown as a vacuum chuck 31. Like chuck 21, chuck 31 has an array of vacuum holes 33 extending therethrough. The vacuum is drawn through holes 33 via vacuum source 35 to pull a distorted wafer 37 tight against chuck 31. As described above, the small, single digit numerals located adjacent to the lower right of each hole 33 schematically illustrate the timing sequence of the vacuum applied to holes 33.

In this version, the vacuum is first drawn through the hole immediately adjacent to the right side of the centermost hole 33, labeled "1." The eight, square-arrayed holes 33 labeled "2" immediately surrounding the hole 33 labeled "1" (FIG. 3a) are evacuated shortly thereafter in a generally concentric pattern. The timing sequence progresses to the array of twelve holes 33 labeled "3," and so on. In FIG. 3a, the dashed lines joining respective ones of the like-enumerated holes 33 assist in graphically illustrating the timing sequence of the vacuum.

This second embodiment is ideally suited for correcting the asymmetrical distortion of a wafer that is distorted in two planes, such as the (greatly exaggerated) concave wafer 37 in FIGS. 3b and 3c. Wafer 37 bows in each of the planes and directions shown in FIGS. 3b and 3c. The vacuum timing sequence initially draws wafer 37 tight against chuck 31 at the smallest gap near the center. The system then progressively evacuates the surrounding holes 33 in numerical order such that the next-smallest gaps between wafer 37 and chuck 31 are minimized, and so on, until the entire 37 is pulled tight against chuck 31.

Referring now to FIG. 4, a third embodiment of a system and method for processing a wafer is shown as a vacuum chuck 41. Like chuck 31, chuck 41 is ideally suited for correcting biplanar distortion of a wafer, such as the concave wafer 37 illustrated in FIGS. 3b and 3c. Chuck 41 has an array of vacuum holes 43 with small numerals located adjacent to the lower right of each hole 43 for schematically illustrating the timing sequence of the vacuum applied to holes 43.

In this version, the vacuum is first drawn through the near-center hole 43, labeled "1" (FIG. 4). The four, diamond-arrayed holes 43 labeled "2" immediately surrounding the near-center hole 43 are evacuated shortly thereafter. The timing sequence concentrically progresses to the four, square-arrayed holes 43 labeled "3," and so on to the perimeter hole 43 labeled "9." The dashed lines joining respective ones of the like-enumerated holes 43 assist in graphically illustrating the vacuum sequence. The vacuum timing sequence initially draws the wafer tight against chuck 41 at the smallest gap near the center. The system then progressively evacuates the surrounding holes 43 in numerical order such that the next-smallest gaps between the wafer and chuck 41 are minimized.

Referring now to FIGS. 5a and 5b, a fourth embodiment of a system and method for processing a wafer is shown as a vacuum chuck 51. Chuck 51 is designed to correct an asymmetrical, convex distortion in a wafer, such as wafer 57 in FIG. 5b. The asymmetrical distortions in wafer 57 render its exaggerated appearance as somewhat like the lemniscatic undulations of a potato chip. Chuck 51 has an array of enumerated vacuum holes 53 for schematically illustrating the timing sequence of the vacuum 55 applied to holes 53. In this version, the vacuum is first drawn through the leftmost hole 53, labeled "1." The remaining holes 53 are evacuated in the enumerated order, essentially moving from the center outward and from left to right, one set after another. The dashed lines joining respective ones of the like-enumerated holes 53 in FIG. 5a help illustrate the generally columnar sequence. The vacuum timing sequence initially draws wafer 57 tight against chuck 51 at the smallest gap on the center left before progressively evacuating the other holes 53 in numerical order such that the gaps between wafer 57 and chuck 51 are minimized.

A fifth embodiment of the invention is shown as a vacuum chuck 61 in FIGS. 6a—6c. Chuck 61 is designed to correct convex distortion in a wafer, such as wafer 67 in FIGS. 6b and 6c. Chuck 61 has an array of enumerated vacuum holes 63 for schematically illustrating the timing sequence of the vacuum 65 applied thereto. In this version, the vacuum is first drawn through the leftmost hole 63, labeled "1." The remaining holes 63 are evacuated in the enumerated order, again essentially moving from the center outward and from left to right. The dashed lines and arrows in FIG. 6a help illustrate the sequence. The vacuum timing sequence draws wafer 67 tight against chuck 61 at the smallest gap on the center left and progressively evacuates the other holes 53 in sequence to minimize the gaps between wafer 67 and chuck 61.

In FIGS. 7a–7c, a sixth embodiment of the invention is shown as a vacuum chuck 71. Chuck 71 corrects convex distortion in a wafer, such as wafer 77 in FIGS. 7b and 7c. Chuck 71 has an array of enumerated vacuum holes 73 which illustrate the timing sequence of the vacuum 75 applied thereto. The vacuum is initially drawn through the leftmost hole 73, labeled "1" and proceeds directly to the right to the holes 73 labeled "2", "3", and "4." After the holes 73 labeled "4" are evacuated, two sets of horizontal rows of holes 73 are evacuated as represented at numerals "5" and "6." Next, the vacuum is applied to the two perimeter holes 73 enumerated "7," before the two vertical columns of holes 73 labeled "8" and "9" are sequentially evacuated. The dashed lines and arrows in FIG. 7a illustrate this sequence.

Another embodiment of the invention is shown as a vacuum chuck 81 in FIGS. 8a–8c. Chuck 81 is designed to correct convex distortion in a wafer, such as wafer 87 in FIGS. 8b and 8c. Chuck 81 has an array of enumerated vacuum holes 83 which illustrate the timing sequence of the vacuum 85 applied thereto. The vacuum is initially drawn through the leftmost hole 83, labeled "1." After hole 83 "2" is evacuated, an arrowhead pattern is established beginning with the three holes 83 labeled "3." The arrowhead pattern continues with hole 83 sets "4" through "7" before the two holes "8" are evacuated. The dashed lines and arrows in FIG. 8a help illustrate the sequence. The vacuum timing sequence draws wafer 87 tight against chuck 81 at the smallest gap on the center left and progressively evacuates the other holes 83 in sequence to minimize the gaps between wafer 87 and chuck 81.

Referring now to FIG. 9, one apparatus and method for implementing the previously described vacuum timing sequences is shown. FIG. 9 illustrates a vacuum chuck 91 having an array or plurality of holes 93 that extend therethrough to its upper surface. The lower end of each hole 93 is interconnected to a conduit with a valve 95, such as a solenoid valve, mounted thereto. The conduits and valves 95 are connected in parallel to a vacuum pump 97 for drawing a vacuum through holes 93 in order to secure an object such as a wafer 98. Both the valves 95 and vacuum pump 97 are controlled via a controller 99, such as a microprocessor. Controller 99 sequences the opening of valves 95 such that any of the previously described evacuation patterns may be accomplished in order to overcome many different types of distortion in wafer 98.

Figure 10:
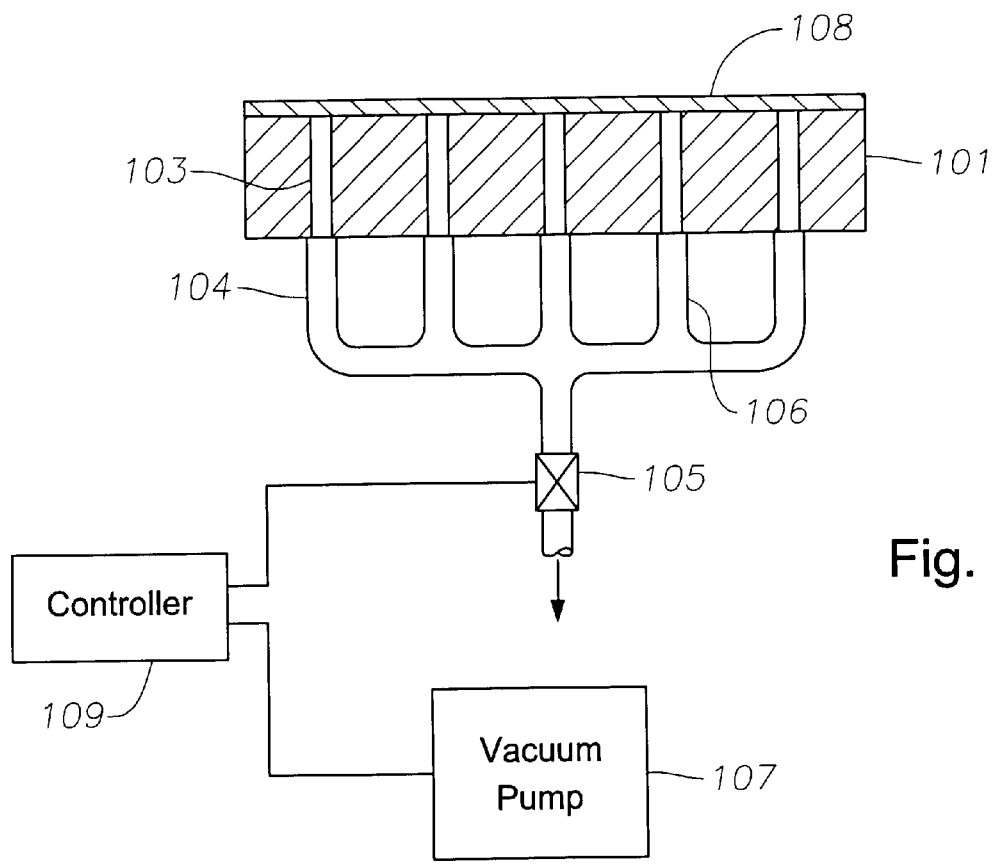
FIG. 10 is a schematic sectional side view of a vacuum chuck with an alternate version of a mechanism for sequencing a vacuum across the chuck.

Another apparatus and method for implementing the previously described vacuum timing sequences is shown in FIG. 10. Here, a vacuum chuck 101 has an array throughholes 103 that extend to its upper surface. The lower end of each hole 103 is interconnected to a manifold through a single valve 105. The manifold and valve 105 are connected to a vacuum pump 107 for drawing a vacuum through holes 103 to secure an object such as a wafer 108. Note that the different tubes comprising the manifold vary in length. For example, tube 104 is significantly longer than tube 106, thus permitting tube 106 and its respective hole 103 to be evacuated prior to tube 104 and its respective hole 103. The simple variance in tube length allows an operator to sequence the vacuum applied to holes 103 as needed. Both the valve 105 and vacuum pump 107 are controlled via a controller 109, such as a microprocessor. Controller 109 sequences the opening of valve 105 such that any of the previously described evacuation patterns may be accomplished in order to overcome many different types of distortion in wafer 108.

The invention has several advantages including the ability to independently control each of the holes in a vacuum chuck to correct distortions that are not symmetrical about a line normal to the wafer and through its center. In other words, the distorted wafer does not have to look like a "perfect bowl." Moreover, the invention is capable of minimizing residual gaps between wafers having a variety of distortions and the chuck so that process variations across each wafer, and from one wafer to the next wafer are minimized. When process variation is minimized, the process mean can be more accurately moved to the nominal condition to improve yields and, hence, lower manufacturing costs. In GMR head wafer processes such as photoresist exposure, flat wafers are essential for achieving sub-halfmicron pole tip and GMR sensor dimensions. This system and method is capable of reducing symmetrical and nonsymmetrical distortions such as non-flat spherical and/or cylindrical shapes. The requirement of a microprocessor in the first of the two method for implementing sequenced vacuum patterns is not a drawback since a microprocessor is typically required in wafer processing equipment to control movement of other parts of the machine.

While the invention has been shown or described in only some of its forms, it should be apparent to those skilled in the art that it is not so limited, but is susceptible to various changes without departing from the scope of the invention. For example, other timing sequences are possible to nullify other types of wafer distortion patterns.

What is claimed is:

1. An apparatus for overcoming distortions in a workpiece, comprising:

a vacuum chuck having a surface, a perimeter, and an array of ports extending through the surface inside the perimeter, the surface being adapted to support a workpiece thereon;

a vacuum source for drawing a vacuum through the array of ports such that the workpiece is adapted to adhere to the surface of the vacuum chuck;

control means for selectively evacuating the array of ports in the vacuum chuck via the vacuum source in a timed sequence so as to overcome asymmetrical distortion in the workpiece; and wherein the ports are arranged in multiple, symmetrical, concentric square rings centered on a central port located at an intersection of perpendicular surface axes, with at least some of the ports aligned with each of the axes, and a plurality of outlying ports aligned with the axes and located radially beyond an outermost square ring adjacent to a perimeter of the chuck.

2. The apparatus of claim 1 wherein the control means selectively evacuates the array of ports generally from approximately a center of the workpiece to two perimeter sides of the workpiece, and from approximately the center of the workpiece to two lateral perimeter sides of the workpiece.

3. The apparatus of claim 1 wherein the control means selectively evacuates the array of ports in a generally radial pattern from approximately a center of the workpiece to the perimeter of the workpiece.

4. The apparatus of claim 1 wherein the control means selectively evacuates the array of ports generally from one side of the workpiece to an opposite side of the workpiece.

5. The apparatus of claim 1 wherein the control means selectively evacuates the array of ports generally from approximately a center of a first side of the workpiece radially outward to a second side of the workpiece.

6. The apparatus of claim 1 wherein the control means selectively evacuates the array of ports generally from approximately a center of a first side of the workpiece radially inward to approximately a center of the workpiece, and radially outward to the perimeter of the workpiece.

7. The apparatus of claim 1 wherein the control means selectively evacuates the array of ports generally from approximately a center of a first side of the workpiece radially across the workpiece to approximately a center of an opposite side of the workpiece, and radially outward in two directions to the perimeter of the workpiece.

8. An apparatus for overcoming distortions in a workpiece, comprising:

a vacuum chuck having a planer surface with a lateral axis extending from a first lateral side to a second and opposite lateral side, and a transverse axis perpendicular to the lateral axis extending from a first transverse side to a second and opposite transverse side, and an array of ports extending through the surface with at least some of the ports being generally located along each of the axes, the surface being adapted to support a workpiece thereon;

a vacuum source for drawing a vacuum through the array of ports such that the workpiece is adapted to adhere to the surface of the vacuum chuck;

a controller for selectively evacuating the array of ports in the vacuum chuck via the vacuum source in a timed sequence so as to overcome asymmetrical distortion in the workpiece; and wherein the ports are arranged in multiple, symmetrical, concentric, square rings centered on a central port located at an intersection of the axes, and a plurality of outlying ports aligned with the axes and located radially beyond an outermost square ring adjacent to a perimeter of the chuck.

9. The apparatus of claim 8 wherein the controller selectively evacuates the array of ports generally from a center of the workpiece to each of the transverse sides of the workpiece, and in columns from approximately the center of the workpiece to each of the lateral sides of the workpiece.

10. The apparatus of claim 8 wherein the controller selectively evacuates the array of ports in a generally radial pattern from approximately a center of the workpiece simultaneously to both the lateral and transverse sides of the workpiece in a concentric pattern.

11. The apparatus of claim 8 wherein the controller selectively evacuates the array of ports generally from the first lateral side of the workpiece to the second lateral side of the workpiece in columns while expanding to each of the transverse sides of the workpiece.

12. The apparatus of claim 8 wherein the controller selectively evacuates the array of ports generally from approximately a center of the first lateral side of the workpiece radially across the workpiece in columns to the second lateral side of the workpiece and radially outward to each of the transverse sides of the workpiece.

13. The apparatus of claim 8 wherein the controller selectively evacuates the array of ports generally from approximately a center of the first lateral side of the workpiece radially inward to approximately a center of the workpiece, radially outward to each of the transverse sides of the workpiece in columns, and laterally across the workpiece in columns from approximately the center of the workpiece to the second lateral side of the workpiece.

14. The apparatus of claim 8 wherein the controller selectively evacuates the array of ports generally from a center of the first lateral side of the workpiece radially across the workpiece to approximately a center of the second lateral side of the workpiece, and radially outward toward both transverse sides of the workpiece in an arrowhead pattern.

15. An apparatus for overcoming lemniscatic distortions in a workpiece, comprising:

a vacuum chuck having a planer surface that is adapted to support the workpiece, the surface having a lateral axis extending from a first lateral side to a second and opposite lateral side, and a transverse axis perpendicular to the lateral axis extending from a first transverse side to a second and opposite transverse side;

ports extending through the surface and arrayed in multiple, symmetrical, concentric, square rings centered on a central port located at an intersection of the axes, with at least some of the ports aligned with each of the axes, and a plurality of outlying ports aligned with the axes and located radially beyond an outermost square ring adjacent to a perimeter of the chuck;

a tube coupled to and extending from each of the ports, wherein the tubes vary in length to vary their sequence of evacuation;

a tube manifold interconnected to each of the tubes and having a valve;

a vacuum source coupled to the tube manifold for drawing a vacuum through the ports such that the workpiece adheres to the surface of the vacuum chuck; and a controller for selectively evacuating the ports via the vacuum source in asymmetrical, off-center patterns to correct lemniscatic undulation in the workpiece.

* * * * *

UNITED STATES PATENT AND TRADEMARK OFFICE
CERTIFICATE OF CORRECTION

PATENT NO.      : 6,446,948 B1                                      Page 1 of 1
DATED           : September 10, 2002
INVENTOR(S)     : Allen It is certified that error appears in the above-identified patent and that said Letters Patent is hereby corrected as shown below:

Title page,
Below the listing for the Primary Examiner, please add
-- [74] *Attorney, Agent, or Firm* -- Bracewell & Patterson, L.L.P. --

Signed and Sealed this

Twenty-first Day of October, 2003

JAMES E. ROGAN
*Director of the United States Patent and Trademark Office*